(12) United States Patent
Ikeda et al.

(10) Patent No.: US 10,892,176 B2
(45) Date of Patent: Jan. 12, 2021

(54) SUBSTRATE PROCESSING APPARATUS HAVING TOP PLATE WITH THROUGH HOLE AND SUBSTRATE PROCESSING METHOD

(71) Applicant: Tokyo Electron Limited, Tokyo (JP)

(72) Inventors: Yoshinori Ikeda, Kumamoto (JP); Shota Umezaki, Kumamoto (JP); Kenji Nishi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/407,245

(22) Filed: May 9, 2019

(65) Prior Publication Data

US 2019/0355593 A1    Nov. 21, 2019

(30) Foreign Application Priority Data

May 15, 2018    (JP) .................................. 2018-093939

(51) Int. Cl.
*H01L 21/67*    (2006.01)
*H01L 21/02*    (2006.01)
(Continued)

(52) U.S. Cl.
CPC ........ *H01L 21/6719* (2013.01); *B05C 11/023* (2013.01); *F26B 21/028* (2013.01);
(Continued)

(58) Field of Classification Search
CPC ..... B05C 11/023; B05D 1/005; F26B 21/028; H01L 21/68764
See application file for complete search history.

(56) References Cited

U.S. PATENT DOCUMENTS 7,914,626 B2 *   3/2011  Uchida ............. H01L 21/67057
                                                           134/26
8,703,403 B2 *   4/2014  Huang ............... H01L 21/67028
                                                           430/322
(Continued)

FOREIGN PATENT DOCUMENTS

JP        2001-319845 A    11/2001

OTHER PUBLICATIONS

Merriam-Webster. "Include-definition", Sep. 14, 2020. Merriam-Webster, Incorporated. https://www.merriam-webster.com/dictionary/include, p. 2. (Year: 2020).*

*Primary Examiner* — Karl Kurple
(74) *Attorney, Agent, or Firm* — Abelman, Frayne & Schwab

(57) ABSTRACT

A substrate processing apparatus according to an aspect of the present disclosure includes a substrate holder, a top plate portion, a gas supply unit, and an arm. The substrate holder holds a substrate. The top plate is installed to face the substrate held on the substrate holder, and has a through hole formed therethrough at a position facing the center of the substrate. The gas supply supplies an atmosphere adjustment gas to a space between the substrate holder and the top plate. The processing liquid nozzle ejects a liquid to the substrate. The arm holds the processing liquid nozzle and moves the processing liquid nozzle between a processing position where the processing liquid is ejected from the processing liquid nozzle through the through hole and a standby position outside the substrate.

9 Claims, 13 Drawing Sheets

(51) Int. Cl.
  *B05C 11/02* (2006.01)
  *H01L 21/687* (2006.01)
  *F26B 21/02* (2006.01)
  *B05B 15/555* (2018.01)
  *B05D 1/00* (2006.01)

(52) U.S. Cl.
  CPC .. *H01L 21/02057* (2013.01); *H01L 21/68764* (2013.01); *H01L 21/68771* (2013.01); *B05B 15/555* (2018.02); *B05D 1/005* (2013.01)

(56) References Cited

U.S. PATENT DOCUMENTS

| | | | | |
|---|---|---|---|---|
| 9,070,731 | B2* | 6/2015 | Tachibana | H01L 21/68742 |
| 9,162,247 | B2* | 10/2015 | Yoshihara | G03F 7/162 |
| 9,176,387 | B2* | 11/2015 | Huang | H01L 21/67028 |
| 9,687,873 | B2* | 6/2017 | Tachibana | B05C 11/023 |
| | | | | 430/319 |
| 9,947,534 | B2* | 4/2018 | Yoshihara | H01L 21/0271 |
| 10,307,724 | B2* | 6/2019 | Crnogorac | G03F 7/30 |
| 2001/0003964 | A1* | 6/2001 | Kitano | G03F 7/162 |
| | | | | 118/50 |
| 2003/0097983 | A1* | 5/2003 | Kitano | B05B 13/041 |
| | | | | 118/712 |
| 2003/0196683 | A1* | 10/2003 | Izumi | H01L 21/02052 |
| | | | | 134/2 |
| 2007/0125405 | A1* | 6/2007 | Sekiguchi | C11D 11/0047 |
| | | | | 134/34 |
| 2008/0078426 | A1* | 4/2008 | Miya | H01L 21/67051 |
| | | | | 134/30 |
| 2011/0200321 | A1* | 8/2011 | Takiguchi | H01L 21/67178 |
| | | | | 396/577 |
| 2013/0011555 | A1* | 1/2013 | Sawada | H01L 21/6715 |
| | | | | 427/240 |
| 2013/0104940 | A1* | 5/2013 | Nagamine | H01L 21/6715 |
| | | | | 134/30 |
| 2013/0333722 | A1* | 12/2013 | Tanaka | B08B 3/003 |
| | | | | 134/1 |
| 2015/0155197 | A1* | 6/2015 | Tachibana | G03F 7/162 |
| | | | | 438/782 |

* cited by examiner

SUBSTRATE PROCESSING APPARATUS HAVING TOP PLATE WITH THROUGH HOLE AND SUBSTRATE PROCESSING METHOD

CROSS-REFERENCE TO RELATED APPLICATIONS

This application is based on and claims priority from Japanese Patent Application No. 2018-093939, filed on May 15, 2018, with the Japan Patent Office, the disclosure of which is incorporated herein in its entirety by reference.

TECHNICAL FIELD

The present disclosure relates to a substrate processing apparatus and a substrate processing method.

BACKGROUND

In a substrate processing apparatus that processes a substrate such as, for example, a semiconductor wafer (hereinafter, referred to as a "wafer") in the related art, the air atmosphere is cleaned with a fan filter unit (FFU) to be supplied into the housing (e.g., for example, Japanese Patent Laid-open Publication No. 2001-319845).

SUMMARY

According to an aspect of the present disclosure, a substrate processing apparatus includes a substrate holder, a top plate, a gas supply, and an arm. The substrate holder holds a substrate. The top plate is installed to face the substrate held on the substrate holder, and has a through hole formed therethrough at a position facing the center of the substrate. The gas supply supplies an atmosphere adjustment gas to a space between the substrate holder and the top plate. The processing liquid nozzle ejects a processing liquid to the substrate. The arm holds the processing liquid nozzle and moves the processing liquid nozzle between a processing position where the processing liquid is ejected from the processing liquid nozzle through the through hole and a standby position outside the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part of the present disclosure. The illustrative embodiments described in the detailed description, drawing, and claims are not meant to be in any way limiting. Other embodiments may be utilized, and other changes may be made without departing from the spirit or the scope of the subject matter presented here.

Hereinafter, embodiments of a substrate processing apparatus and a substrate processing method disclosed herein will be described in detail with reference to the accompanying drawings. The present disclosure is not limited by the embodiments described below. It is to be noted that the views are schematic and that the dimensional relationships and the proportions of respective elements may differ from reality. Furthermore, even between the drawings, there may be a case where the dimensional relationships and proportions differ from one another.

In the related art, in a substrate processing apparatus that processes a substrate such as, for example, a wafer, an air atmosphere cleaned using an FFU is supplied into a housing.

Meanwhile, depending on the processing, the atmosphere around the wafer may be adjusted to predetermined conditions such as, for example, low humidity and low oxygen concentration instead of the air atmosphere. However, when the atmosphere of the entire inside of the housing is adjusted with a gas for adjusting the atmosphere to a predetermined condition (hereinafter, referred to as an "atmosphere adjustment gas"), the amount of the atmosphere adjustment gas used may be increased.

Accordingly, it is expected to reduce the amount of the atmosphere adjustment gas used when processing a wafer.

<Outline of Substrate Processing System>

Figure 1:
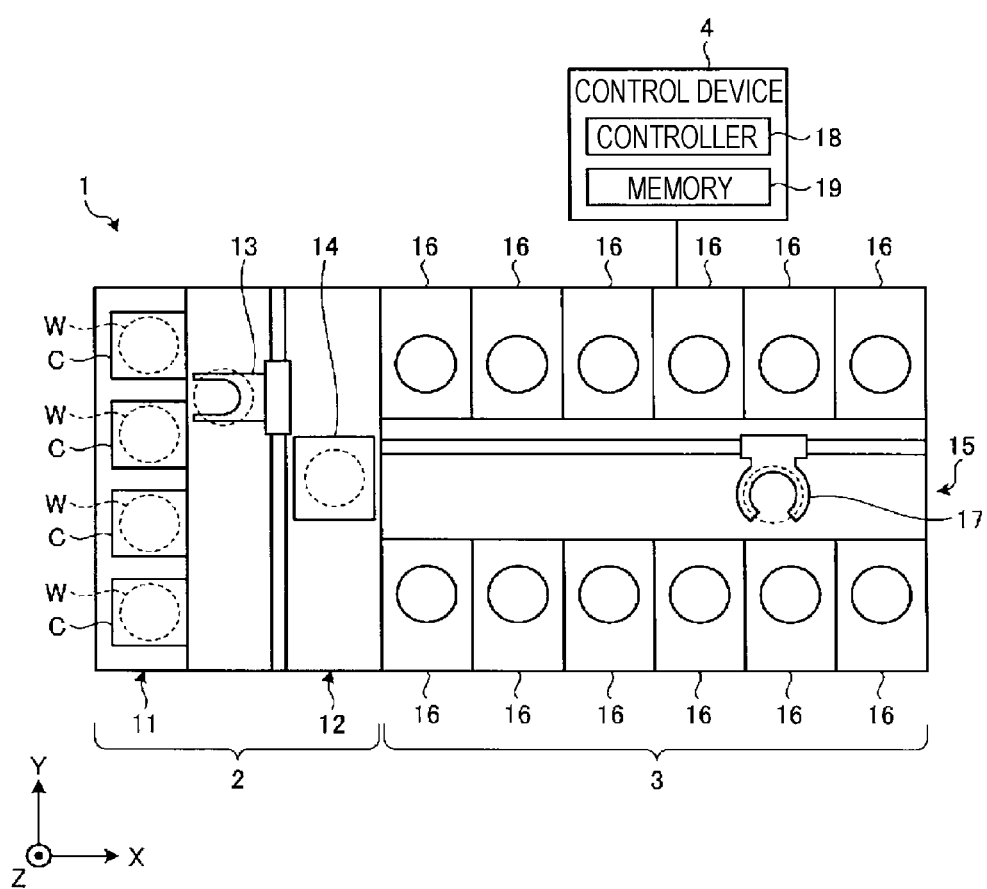
FIG. 1 is a schematic view illustrating a schematic configuration of a substrate processing system according to an embodiment.

First, a schematic configuration of a substrate processing system 1 according to an embodiment will be described with reference to FIG. 1. FIG. 1 is a schematic view illustrating the schematic configuration of the substrate processing system 1 according to the embodiment. In the following description, in order to clarify a positional relationship, an X axis, a Y axis, and a Z axis which are orthogonal to each other are defined, and the Z-axis positive direction is defined as a vertically upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 includes a carrier placing section 11 and a transport section 12. A plurality of carriers C each configured to accommodate a plurality of substrates (semiconductor wafers W in the embodiments (hereinafter, referred to as "wafers W")) in a horizontal state are placed in the carrier placing section 11. The wafers W are examples of substrates.

The transport section 12 is provided adjacent to the carrier placing section 11 and includes therein a substrate transport device 13 and a delivery unit 14. The substrate transport device 13 includes a wafer holding mechanism configured to hold a wafer W. Further, the substrate transport device 13 is capable of moving in the horizontal direction and vertical direction and rotating about the vertical axis, and transports wafers W between the carriers C and the delivery unit 14 using a wafer holding mechanism.

The processing station 3 is provided adjacent to the transport section 12. The processing station 3 includes a transport section 15 and a plurality of processing units 16. The plurality of processing units 16 are arranged side by side on the opposite sides of the transport section 15. The processing units 16 are examples of substrate processing apparatuses.

The transport section 15 includes a substrate transport device 13 therein. The substrate transport device 17 includes a wafer holding mechanism configured to hold a wafer W. Further, the substrate transport device 17 is capable of moving in the horizontal direction and vertical direction and rotating about the vertical axis, and transports wafers W between the delivery unit 14 and the processing units 16 using a wafer holding mechanism.

The processing units 16 perform predetermined processings on the wafers W transported by the substrate transport device 17. Details of the processing units 16 will be described later.

In addition, the substrate processing system 1 includes a control device 4. The control device 4 is, for example, a computer, and includes a controller 18 and a memory 19. In the memory 19, a program for controlling various processings executed in the substrate processing system 1 is stored. The controller 18 controls the operation of the substrate processing system 1 by reading and executing the program stored in the memory 19.

In addition, such a program may be stored in a computer-readable storage medium by a computer and installed in the memory 19 of the control device 4 from the storage medium. The computer-readable storage medium includes, for example, a hard disk (HD), a flexible disk (FD), a compact disk (CD), a magneto optical disk (MO), and a memory card.

In the substrate processing system 1 configured as described above, first, the substrate transport device 13 of the carry-in/out station 2 takes out a wafer W from a carrier C placed on the carrier placing section 11 and places the taken-out wafer W on the delivery unit 14. The wafer W placed on the delivery unit 14 is taken out from the delivery unit 14 by the substrate transport device 17 in the processing station 3 and is carried into a processing unit 16.

The wafer W carried into the processing unit 16 is processed by the cleaning processing unit 16, and then carried out from the processing unit 16 and placed on the delivery unit 14 by the substrate transport device 17. Then, the processed wafer W placed on the deliver unit 14 is returned to a carrier C in the carrier placing section 11 by the substrate transport device 13.

<Outline of Processing Unit>

Figure 2:
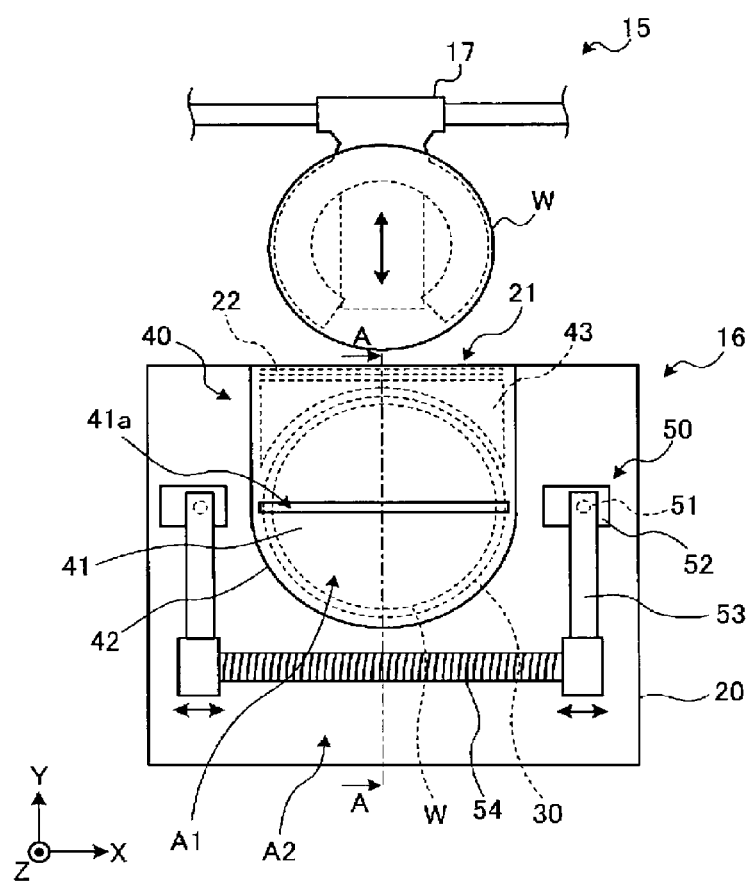
FIG. 2 is a top plan view illustrating the configuration of a processing unit according to the embodiment.
Figure 3:
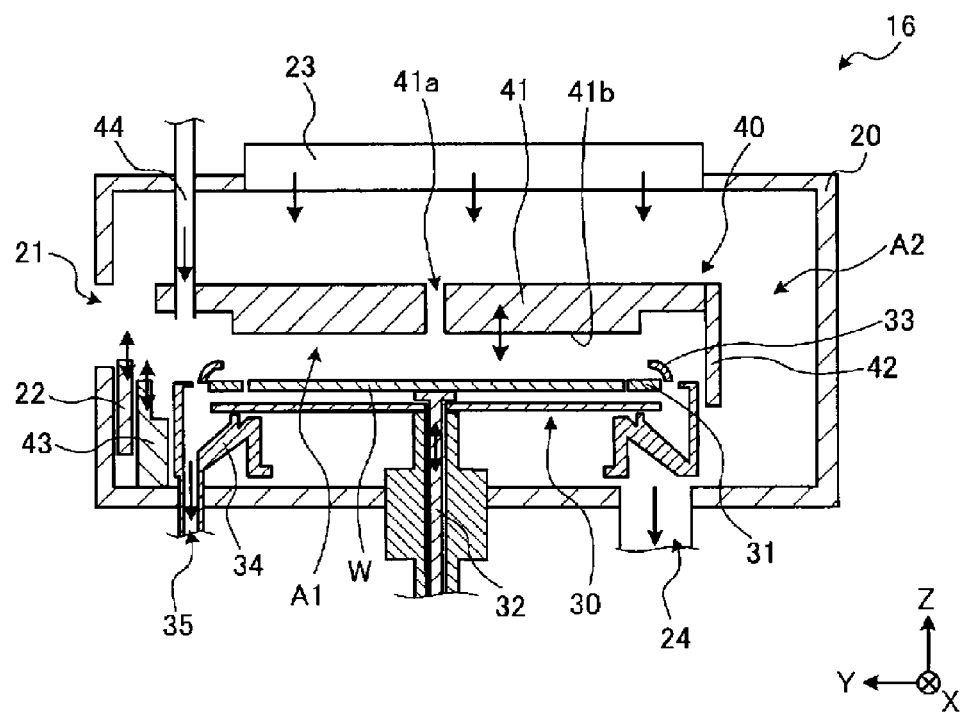
FIG. 3 is a cross-sectional view taken along line A-A in FIG. 2.

Next, the outline of a processing unit 16 will be described with reference to FIGS. 2 and 3. FIG. 2 is a cross-sectional view illustrating the configuration of the processing unit 16 according to the embodiment, and FIG. 3 is a cross-sectional view taken along line A-A in FIG. 2. For easy understanding, FIG. 3 illustrates a state in which a wafer W is carried in, and the illustration of a lead screw 54 is omitted.

As illustrated in FIG. 2, the processing unit 16 includes a housing 20, a substrate processing unit 30, a partition unit 40, and a liquid supply unit 50. The housing 20 accommodates the substrate processing unit 30, the partition unit 40, and the liquid supply unit 50.

The housing 20 has a carry-in/out port 21 at a position where the housing 20 is in contact with the transport section 15. Then, the wafer W transferred by the substrate transport device 17 of the transport section 15 is carried into the inside of the housing 20 from the carry-in/out port 21. In addition, the housing 20 has a shutter 22 configured to be able to open and close the carry-in/out port 21.

As illustrated in FIG. 3, an FFU 23 is provided on the ceiling portion of the housing 20. The FFU 23 forms a down flow of the clean air atmosphere supplied into the housing 20. In addition, in the bottom portion of the housing 20, an exhaust port 24 is formed to discharge the air atmosphere supplied from the FFU 23 to the outside of the processing unit 16.

The substrate processing unit 30 performs a predetermined liquid processing on the wafer W. As illustrated in FIG. 3, the substrate processing unit 30 includes a substrate holding unit 31, a column portion 32, a liquid receiving cup 33, a recovery cup 34, and a drainage port 35. The substrate holding unit 31 holds the wafer W horizontally. The substrate holding unit 31 holds, for example, the outer edge portion of the wafer W from the lateral side.

The column portion 32 is a member extending in the vertical direction, and the lower end of the column portion 32 is rotatably supported by a drive unit (not illustrated). In addition, although not illustrated in FIG. 3, the column portion 32 may horizontally support the substrate holding unit 31 at the upper end portion thereof.

Then, the substrate processing unit 30 rotates the substrate holding unit 31 supported by the column portion 32 by rotating the column portion 32 using the driving unit. Thus, the substrate processing unit 30 rotates the wafer W held by the substrate holding unit 31. In addition, the column portion 32 is configured to be vertically movable, and is capable of moving toward the wafer W carried into the upper side of the substrate processing unit 30 to receive the wafer W.

The liquid receiving cup 33 has a substantially annular shape and has a curved shape that is recessed downward. The liquid receiving cup 33 is disposed so as to surround the outer edge portion of the substrate holding unit 31, and collects a processing liquid L (see FIG. 4C) scattered from the wafer W by the rotation of the substrate holding unit 31. For example, the liquid receiving cup 33 is disposed to surround the outer edge portion of substrate holding unit 31 at least above the plane which is the same as the wafer W held by substrate holder 31. In addition, the liquid receiving cup 33 may rotate together with the substrate holding unit 31.

The recovery cup 34 is disposed to surround the substrate holding unit 31, and collects the processing liquid L scattered from the wafer W by the rotation of the substrate holding unit 31. Although not illustrated in FIG. 3, the recovery cup 34 may be a multi-cup capable of respectively collecting a plurality of processing liquids L.

A drainage port 35 is formed in the bottom portion of the recovery cup 34. Then, the processing liquid L collected by the liquid receiving cup 33 or the recovery cup 34 is discharged from the drainage port 35 to the outside of the processing unit 16.

In the inside of the housing 20, the partition unit 40 partitions a first space A1 from the above-mentioned carry-in/out port 21 to the substrate processing unit 30 and a second space A2 other than the first space A1. In addition, the partition unit 40 is configured to adjust the atmosphere in the partitioned first space to a predetermined condition.

As illustrated in FIG. 3, the partition unit 40 includes a top plate portion 41, a side wall portion 42, a gap filling portion 43, and a gas supply portion 44. The top plate portion 41 having a substantially disk-like shape is provided substantially parallel to the wafer W held by the substrate holder 31, and is disposed to cover the upper side of the wafer W.

In addition, the top plate portion 41 is configured to be vertically movable in the housing 20, and when the wafer W is carried in/out from the carry-in/out port 21, the top plate portion 41 moves upward so as not to interfere with the transport path of the wafer W. Meanwhile, when the wafer W is processed by the substrate processing unit 30, the top plate portion 41 moves to a lower position adjacent to the wafer W.

A through hole 41a is formed in the top plate portion 41 vertically through the top plate portion 41. For example, as illustrated in FIG. 2, the through hole 41a has a slit shape, and is formed to face at least the central portion of the wafer W held by the substrate holding unit 31. In addition, the through hole 41 a is formed such that a processing liquid nozzle 51 described later is capable of being inserted thereinto.

In addition, as illustrated in FIG. 3, the top plate portion 41 has a convex portion 41b protruding toward the wafer W. The convex portion 41 b protrudes, for example, in a substantially cylindrical shape. In addition, the outer diameter of the convex portion 41b is larger than the outer diameter of the wafer W facing the convex portion 41b and smaller than the inner diameter of the liquid receiving cup 33 adjacent to the convex portion 41b.

The side wall portion 42 surrounds the sides of, for example, the substrate holding unit 31 which holds the wafer W, the liquid receiving cup 33, and the top plate portion 41. For example, as illustrated in FIG. 2, in a top view, the side wall portion 42 has a linear shape on the front side where the carry-in/out port 21 is located, and a semicircular shape on the rear side where the wafer W is subjected to a liquid processing.

In the embodiment, the side wall portion 42 is movable up and down integrally with the top plate portion 41. Meanwhile, the side wall portion 42 does not have to move up and down together with the top plate portion 41, and may be fixed in the housing 20. In this case, the top plate portion 41 may be configured to be movable up and down along the fixed side wall portion 42.

When the wafer W is processed by the substrate processing unit 30, the gap filling portion 43 fills a gap (e.g., the periphery of the carry-in/out port 21) other than the substrate processing unit 30 in the first space A1. In addition, the gap filling portion 43 is configured to be movable in the housing 20, and when the wafer W is carried in/out from the carry-in/out port 21, the top plate portion 41 moves to a position so as not to interfere with the transport path of the wafer W. For example, as illustrated in FIG. 2, in a plan view, the gap filling portion 43 has a substantially U shape having an arc shape on the inner side and a rectangular shape on the outer side.

The gas supply unit 44 is connected to the first space A1, and supplies the atmosphere adjustment gas to the first space A1. For example, an ejection nozzle of the atmosphere adjustment gas in the gas supply unit 44 is provided in the top plate portion 41 between the carry-in/out port 21 and the substrate processing unit 30.

In addition, the atmosphere adjustment gas in the embodiment is, for example, an inert gas having an oxygen concentration lower than that of the air atmosphere, such as, for example, nitrogen gas or Ar gas, or a gas having a humidity lower than that of the air atmosphere, such as, for example, dry gas.

The liquid supply unit 50 illustrated in FIG. 2 supplies the processing liquid L to the wafer W held in the first space A1. The liquid supply unit 50 includes a processing liquid nozzle 51, a nozzle bus 52, an arm 53, and a lead screw 54, and is disposed in the second space A2.

The processing liquid nozzle 51 is connected to a processing liquid supply source via a valve and a flow rate controller (not illustrated), and ejects the processing liquid L onto the wafer W using the through holes 41a formed in the top plate portion 41.

The processing liquid L ejected from the processing liquid nozzle 51 includes, for example, various liquids used for various liquid processings of the wafer W, such as, for example, an acid-based processing liquid, an alkali-based processing liquid, an organic processing liquid, and a rinse liquid. The acid-based processing liquid is, for example, diluted hydrofluoric (DHF). The alkali-based processing liquid is, for example, SC1 (a mixed solution of ammonia, hydrogen peroxide, and water). The organic processing liquid is, for example, isopropyl alcohol (IPA). The rinse liquid is, for example, deionized water (DIW).

The nozzle bus 52 is a container configured to cause the processing liquid nozzle 51 to stand by at a standby position and perform dummy dispensing of the processing liquid L from the processing liquid nozzle 51. The arm 53 supports the processing liquid nozzle 51.

The lead screw 54 is formed with a spiral groove. In addition, the lead screw 54 is pivotally supported so as to rotate in a predetermined rotation direction about a rotation axis by transmitting a driving force from a driving unit (not illustrated).

Then, by rotating the lead screw 54 in the predetermined rotation direction, the arm 53 connected to the spiral groove of the lead screw 54 slides along the rotation axis of the lead screw 54 together with the processing liquid nozzle 51. This makes it possible to move the processing liquid nozzle 51 slide to a predetermined position in the housing 20.

In addition, the arm 53 is provided with a lifting mechanism (not illustrated). The liquid supply unit 50 is capable of raising and lowering the processing liquid nozzle 51 by operating the lifting mechanism.

As described above, the liquid supply unit 50 is capable of moving the processing liquid nozzle 51 to the position of the through hole 41*a* and inserting the liquid nozzle 51 into the through hole 41*a* by operating the lead screw 54 and the lifting mechanism. That is, the arm 53 moves the processing liquid nozzle 51 between a processing position at which the processing liquid L is ejected from the processing liquid nozzle 51 via the through hole 41*a* and a standby position outside the wafer W.

In the embodiment, since the through hole 41*a* is in the form of a slit, and the axial direction of the lead screw 54 and the extension direction of the through hole 41*a* are substantially parallel to each other, the processing liquid nozzle 51 is capable of being scan-shifted.

Although the example illustrated in FIG. 2 illustrates the case where the processing liquid nozzle 51, the nozzle bus 52, and the arm 53 are provided in two sets, a predetermined number of processing liquid nozzles 51, nozzle buses 52, and arms 53 may be provided in the processing unit 16 without being limited to the two sets.

In addition, although the example illustrated in FIG. 2 illustrates the case where the processing liquid nozzle 51 is fixed to the arm 53, the processing liquid nozzle 51 may be, for example, a pickup nozzle without being limited to the case where the processing liquid nozzle 51 is fixed to the arm 53. In addition, the mechanism for sliding the arm 53 is not limited to the lead screw 54, and various known mechanisms may be used.

<Details of Liquid Processing>

Subsequently, details of the liquid processing according to the embodiment will be described with reference to FIGS. 4A to 4D. FIGS. 4A to 4D are schematic views (1) to (4) illustrating steps of a liquid processing according to the embodiment.

Figure 4A:
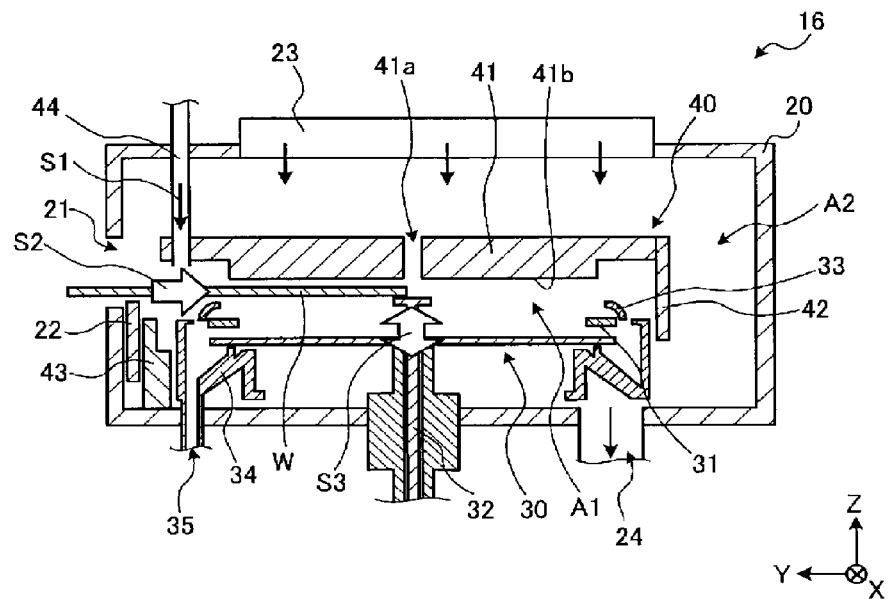
FIG. 4A is a schematic view (1) illustrating a step of a liquid processing according to the embodiment.

As illustrated in FIG. 4A, in the processing unit 16, prior to carrying the wafer W into the substrate processing unit 30, the transport path of the wafer W in the first space A1 is secured. Specifically, the processing unit 16 causes the top plate portion 41 to retreat upward from the transport path of the wafer W, and causes the gap filling portion 43 to retreat downward.

In addition, the processing unit 16 supplies a predetermined atmosphere adjustment gas to the first space A1 using the gas supply unit 44 from a predetermined timing prior to carrying the wafer W into the substrate processing unit 30 (step S1). Thus, the processing unit 16 may replace the atmosphere in the first space A1 with the atmosphere adjustment gas in advance.

Meanwhile, the second space A2 of the processing unit 16 is an air atmosphere cleaned using the FFU 23. In addition, the atmosphere adjustment gas supplied to the first space A1 and the air atmosphere supplied to the second space A2 are commonly exhausted at the exhaust port 24.

Next, the processing unit 16 moves the shutter 22 to open the carry-in/out port 21. Then, the substrate transport device 17 carries the wafer W into the processing unit 16 (step S2). Then, the processing unit 16 receives the wafer W, which has been carried into the upper side of the substrate holding unit 31, with the column portion 32, which has moved upward, moves the wafer W downward, and holds the wafer W by the substrate holding unit 31 (step S3).

Figure 4B:
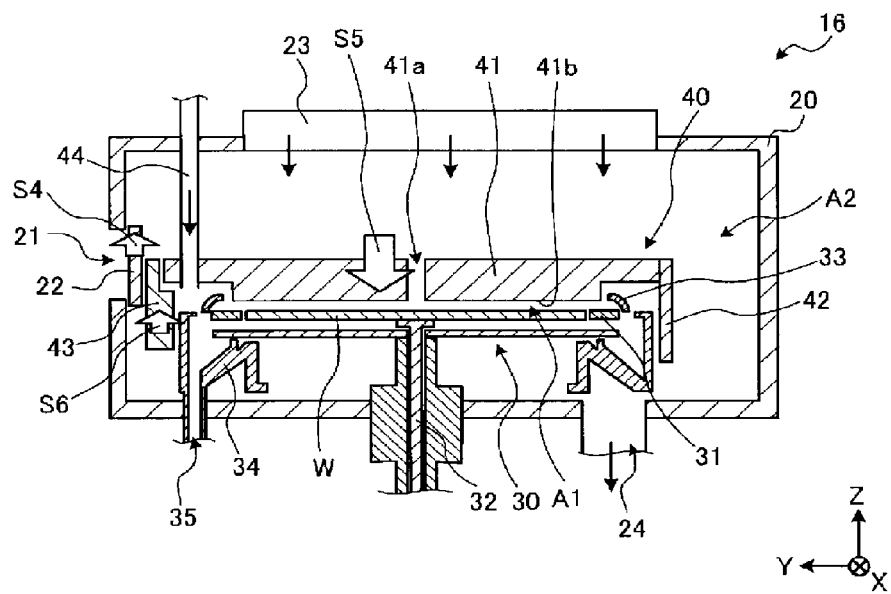
FIG. 4B is a schematic view (2) illustrating a step of a liquid processing according to the embodiment.

Next, as illustrated in FIG. 4B, the processing unit 16 moves the shutter 22 to close the carry-in/out port 21 (step S4). In addition, the processing unit 16 moves the top plate portion 41 downward to approach the wafer W (step S5). For example, in step S5, the top plate portion 41 is brought close to a position where the gap between the top plate portion 41 and the wafer W is about 1 to 4 mm.

In addition, the processing unit 16 moves the gap filling portion 43 upward to fill the gap other than the substrate processing unit 30 in the first space A1 (step S6). The order of steps S4 to S6 illustrated in FIG. 4B is arbitrary, and for example, all of steps S4 to S6 may be performed simultaneously.

In the embodiment, during steps S4 to S6, the processing unit 16 operates the gas supply unit 44 to continuously supply the predetermined atmosphere adjustment gas to the first space A1. This makes it possible to continuously adjust the atmosphere of the first space A1 in which the wafer W is disposed to a predetermined condition.

Figure 4C:
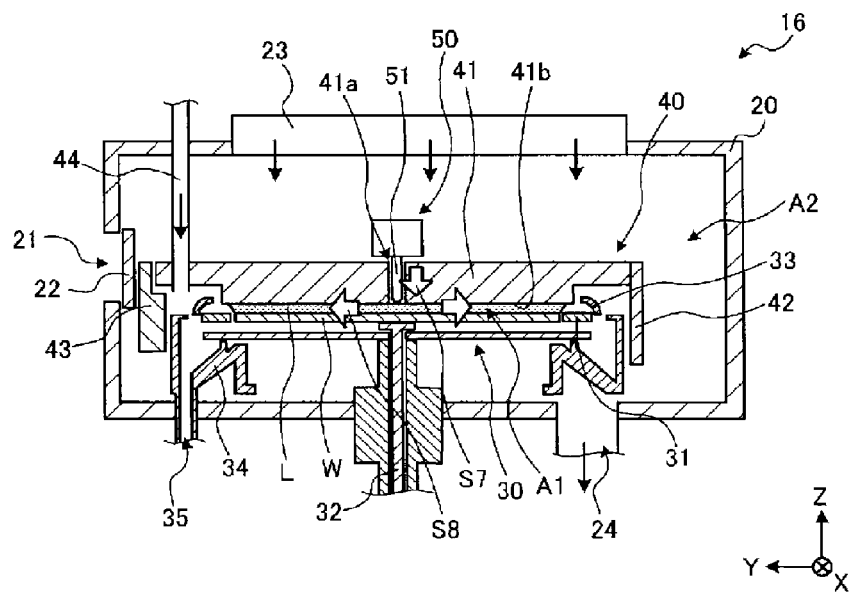
FIG. 4C is a schematic view (3) illustrating a step of a liquid processing according to the embodiment.

Next, as illustrated in FIG. 4C, the processing unit 16 moves the processing liquid nozzle 51 to a predetermined position on the wafer W and inserts the processing liquid nozzle 51 into the through hole 41*a* by operating the liquid supply unit 50 (step S7). Then, the processing unit 16 operates the processing liquid nozzle 51 to supply a predetermined processing liquid L to the wafer W (step S8). The operation of inserting the processing liquid nozzle 51 into the through hole 41*a* may be performed before supplying the atmosphere adjustment gas (e.g., before step S4).

Further, in step S8, the processing unit 16 may rotate or stop the wafer W. In step S8, the liquid supply unit 50 may scan the processing liquid nozzle 51 on the wafer W by a predetermined operation.

Figure 4D:
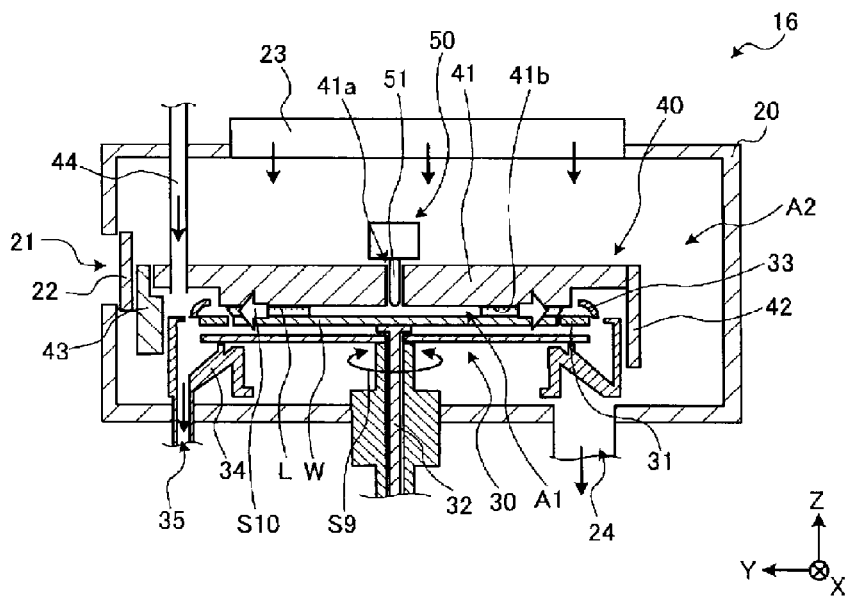
FIG. 4D is a schematic view (4) illustrating a step of a liquid processing according to the embodiment.

Next, as illustrated in FIG. 4D, the processing unit 16 rotates the wafer W by operating the substrate processing unit 30 (step S9). Thus, the processing liquid L moves to the outer peripheral side of the wafer W, and the wafer W is liquid-processed (step S10). In addition, a specific example of this liquid process will be described later.

In the embodiment, during steps S7 to S10, the processing unit 16 operates the gas supply unit 44 to continuously supply the predetermined atmosphere adjustment gas to the first space A1. This makes it possible to continuously adjust the atmosphere around the wafer W subjected to the liquid processing to a predetermined condition.

Here, in the embodiment, an air atmosphere is supplied to the second space A2 in the housing 20, and the atmosphere adjustment gas is supplied only to the first space A1 partitioned by the partition unit 40. Therefore, according to the embodiment, it is possible to reduce the amount of use of the atmosphere adjustment gas during the liquid processing on the wafer W.

In addition, in the embodiment, the top plate portion 41 is brought close to the wafer W, and the gap filling portion 43 fills the gap of the first space A1, whereby the first space A1 is capable of being narrowed. Therefore, according to the embodiment, it is possible to further reduce the amount of use of the atmosphere adjustment gas.

In the embodiment, the inner diameter of the liquid receiving cup 33 may be larger than the outer diameter of the convex portion 41*b* of the top plate portion 41. This makes it possible to bring the top plate portion 41 close to the wafer W without interfering with the liquid receiving cup 33, as illustrated in, for example, FIG. 4B. Therefore, according to the embodiment, it is possible to further reduce the amount of use of the atmosphere adjustment gas.

In the embodiment, as illustrated in FIGS. 4C and 4D, when the wafer W is subjected to the liquid processing, the space between the top plate portion 41 and the wafer W may be filled with the processing liquid L. This makes it possible to make the film thickness of the processing liquid L on the wafer W during the liquid processing uniform. Therefore, according to the embodiment, it is possible to perform the liquid processing of the wafer W in a good state.

In the embodiment, by filling the space between the top plate portion 41 and the wafer W with the processing liquid L, it is possible to suppress the processing liquid L evaporated during a high temperature processing from adhering to the top plate portion 41. In addition, in the embodiment, by filling the space between the top plate portion 41 and the wafer W with the processing liquid L, it may be easy to increase the temperature of the processing liquid L by a heating unit (e.g., a heater) separately added to the top plate portion 41.

In the embodiment, even when the space between the top plate portion 41 and the wafer W is filled with the processing liquid L, the processing liquid L on the surface of the top plate portion 41 may be moved to the outer peripheral side together with the processing liquid L on the surface of the wafer W by initiating the rotation of the wafer W at a relatively low speed and gradually increasing the rotating speed. In the embodiment, this makes it possible to suppress the processing liquid L from remaining on the surface of the top plate portion 41 after the liquid processing.

In the embodiment, for example, as illustrated in FIG. 4D, the outer diameter of the convex portion 41b of the top plate portion 41 may be larger than the outer diameter of the wafer W. Therefore, even if the processing liquid L remains at the outer edge of the convex portion 41b after the liquid processing, it is possible to suppress the remaining processing liquid L from adhering to the wafer W.

When the processing liquid L is left at the outer edge of the convex portion 41b after the liquid processing, the processing liquid L left at the outer edge may be purged with, for example, the atmosphere adjustment gas.

In the embodiment, the through hole 41a may be formed to face at least the central portion of the wafer W held by the substrate holding unit 31. Thus, since it is possible to dispose the processing liquid nozzle 51 above the central portion of the wafer W, it is possible to eject the processing liquid L to the central portion of the wafer W. Therefore, according to the embodiment, it is possible to uniformly supply the processing liquid L to the entire surface of the wafer W.

The continuation of the processing in the processing unit 16 will be described. After completing the liquid processing, the processing unit 16 causes the top plate portion 41 to retreat upward from the transfer path of the wafer W and the gap filling portion 43 to retreat downward to secure the transport path of the wafer W in the first space A1.

Then, the shutter 22 is moved to open the carry-in/out port 21, and the wafer W is carried out from the processing unit 16 using the substrate transport device 17. Finally, the processing unit 16 closes the shutter 22 and stops the supply of the atmosphere adjustment gas by the gas supply unit 44.

As described above, by stopping the supply of the atmosphere adjustment gas to the first space A1 from which the wafer W has been carried out, it is possible to further reduce the amount of use of the atmosphere adjustment gas.

In the embodiment, as described above, the supply of the atmosphere adjustment gas by the gas supply unit 44 may be started before the wafer W is carried into the first space A1, and the first space A1 may be replaced with the atmosphere adjustment gas in advance. This makes it possible to carry the wafer W into the first space A1 in which the atmosphere is adjusted.

In the embodiment, the substrate holding unit 31 may be rotated in the first space A1 when replacing the first space A1 with the atmosphere adjustment gas in advance. This makes it possible to suppress the atmosphere other than the atmosphere adjustment gas from remaining in the first space A1, and thus it is possible to efficiently replace the first space A1 with the atmosphere adjustment gas.

In the embodiment, since the first space A1 and the second space A2 communicate with each other through the through hole 41a, the air atmosphere of the second space A2 may flow into the first space A1 through the through hole 41a.

Accordingly, in the embodiment, the inflow suppressing portion 45 (see FIG. 5A) is provided to suppress the inflow of the air atmosphere into the first space A1. Subsequently, details of the inflow suppressing portion 45 will be described with reference to FIGS. 5A to 5C. In addition, the operation of suppressing the inflow of the air atmosphere by the inflow suppression unit 45 is performed during the supply of the atmosphere adjustment gas.

Figure 5A:
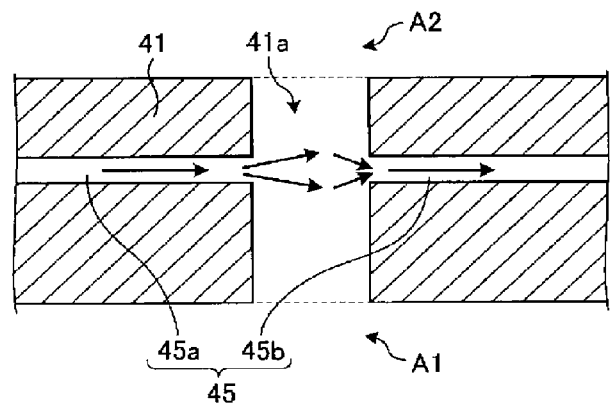
FIG. 5A is a schematic view for explaining an example of an inflow suppressing portion according to the embodiment.

FIG. 5A is a schematic view for describing an example of the inflow suppressing portion 45 according to the embodiment, and is a view schematically illustrating a cross section of a portion including the through hole 41a of the top plate portion 41. As illustrated in FIG. 5A, the inflow suppressing portion 45 includes a first piping portion 45a and a second piping portion 45b.

The first piping portion 45a and the second piping portion 45b are connected to mutually facing positions in the inner wall of the through hole 41a. The first piping portion 45a is connected to a gas supply mechanism (not illustrated) for supplying, for example, the atmosphere adjustment gas, and ejects the gas supplied from the gas supply mechanism into the through hole 41a.

In addition, the second piping portion 45b is connected to an exhaust mechanism (not illustrated), and exhausts the atmosphere in the through hole 41a by the exhaust mechanism. Thus, the inflow suppressing portion 45 is able to form a so-called gas curtain in the through hole 41a by exhausting the gas ejected from the first piping portion 45a into the second piping portion 45b facing the first piping portion 45a.

This makes it possible to suppress the air atmosphere of the second space A2 from flowing into the first space A1. Therefore, according to the embodiment, it is possible to favorably maintain the first space A1 in the atmosphere adjusted to the predetermined condition. In the example illustrated in FIG. 5A, the gas ejected from the second piping portion 45b may be exhausted from the first piping portion 45a facing the second piping portion 45b.

Figure 5B:
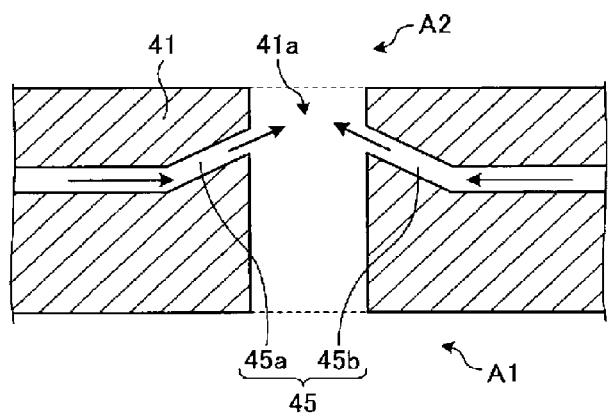
FIG. 5B is a schematic view for explaining another example of an inflow suppressing portion according to the embodiment.

FIG. 5B is a schematic view for explaining another example of the inflow suppressing portion 45 according to the embodiment. In the example of FIG. 5B, for example, the atmosphere adjustment gas is ejected from both the first piping portion 45a and the second piping portion 45b. This also makes it possible to form a gas curtain in the through hole 41a.

Therefore, also in the example of FIG. 5B, since it is possible to suppress the air atmosphere of the second space A2 from flowing into the first space A1, it is possible to favorably maintain the first space A1 in the atmosphere adjusted to the predetermined condition.

In the case where, for example, the atmosphere adjustment gas is ejected from both the first piping portion 45a and the second piping portion 45b, as illustrated in FIG. 5B, the ejection directions of the first piping portion 45a and the second piping portion 45b may face each other toward the upwardly inclined side (i.e., the second space A2 side). Since this makes it possible to efficiently suppress the atmosphere in the second space A2 from flowing into the first space A1, it is possible to more favorably maintain the first space A1 in the atmosphere adjusted to a predetermined condition.

Figure 5C:
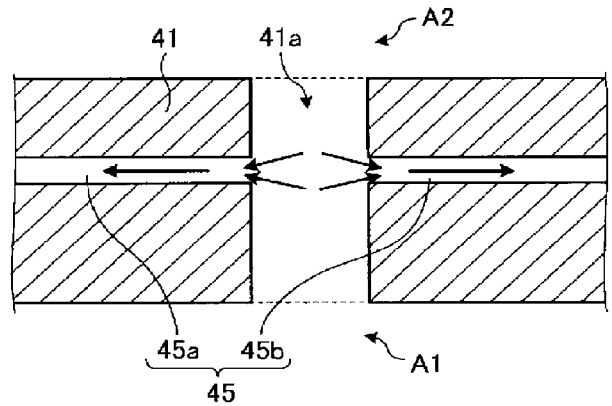
FIG. 5C is a schematic view for explaining still another example of an inflow suppressing portion according to the embodiment.

FIG. 5C is a schematic view for explaining another example of the inflow suppressing portion 45 according to the embodiment. In the example of FIG. 5C, the exhaust is performed from both the first piping portion 45a and the second piping portion 45b. This makes it possible to exhaust the air atmosphere flowing into the through hole 41a from the second space A2 to the outside using the first piping portion 45a and the second piping portion 45b.

Therefore, also in the example of FIG. 5C, since it is possible to suppress the air atmosphere of the second space A2 from flowing into the first space A1, it is possible to favorably maintain the first space A1 in the atmosphere adjusted to the predetermined condition.

In addition, the embodiment illustrates an example in which the processing liquid L is supplied to the wafer W in the state where the processing liquid nozzle 51 is inserted into the through hole 41a. Meanwhile, the processing liquid L may be allowed to flow into the through hole 41a and supplied to the wafer W from the processing liquid nozzle 51 disposed above the through hole 41a without inserting the processing liquid nozzle 51 into the through hole 41a.

Meanwhile, by supplying the processing liquid L to the wafer W in the state where the processing liquid nozzle 51 is inserted into the through hole 41a, the processing liquid L may be ejected in the first space A1 by the inflow suppressing portion 45. That is, the inflow suppressing portion 45 may be caused to function more sufficiently than in the case where the processing liquid L is caused to flow into the through hole 41a.

Therefore, according to the embodiment, by supplying the processing liquid L to the wafer W in the state where the processing liquid nozzle 51 is inserted into the through hole 41a, it is possible to favorably maintain the first space A1 in the atmosphere adjusted to the predetermined condition.

<Modification>

Figure 6:
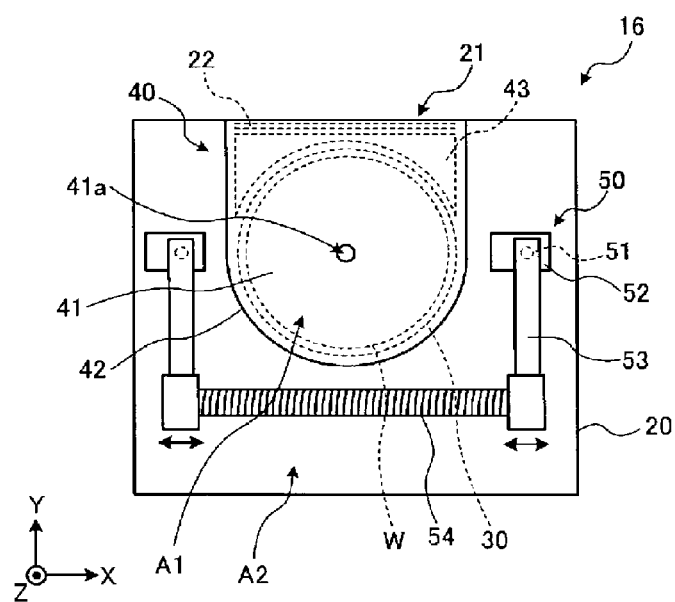
FIG. 6 is a top plan view illustrating the configuration of a processing unit according to Modification 1 of the embodiment.

Subsequently, various modifications of the processing unit 16 according to the embodiment will be described with reference to FIGS. 6 to 9C. FIG. 6 is a top plan view illustrating the configuration of a processing unit 16 according to Modification 1 of the embodiment.

In Modification 1 illustrated in FIG. 6, the through hole 41a is not in the form of a slit, but in the same shape as the processing liquid nozzle 51 to be inserted (e.g., a substantially circular shape). In Modification 1 as well, it is possible to uniformly supply the processing liquid L to the entire surface of the wafer W by disposing the through holes 41a so as to face the central portion of the wafer W held by the substrate holding unit 31.

Figure 7:
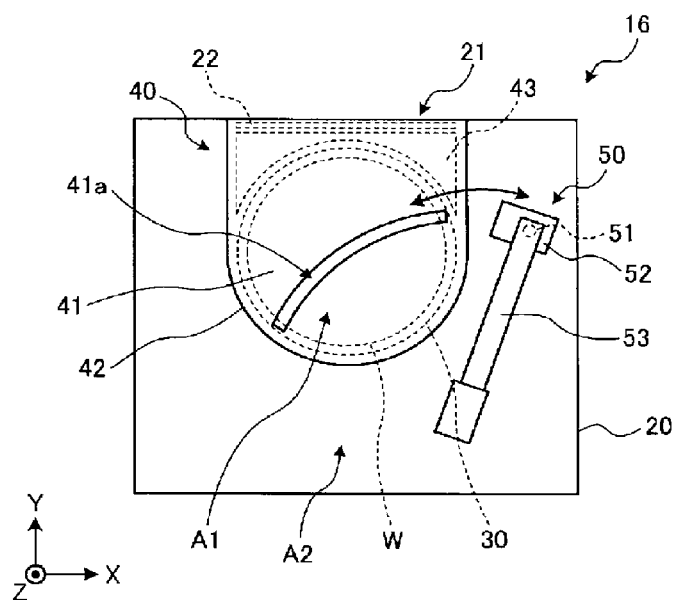
FIG. 7 is a top plan view illustrating the configuration of a processing unit according to Modification 2 of the embodiment.

FIG. 7 is a top plan view illustrating the configuration of a processing unit 16 according to Modification 2 of the embodiment. In Modification 2 illustrated in FIG. 7, the through hole 41a is not a linear slit, but an arcuate slit.

In Modification 2, the liquid supply unit 50 is configured such that the processing liquid nozzle 51 rotates along the through hole 41a, thereby scan-shifting the processing liquid nozzle 51 in the through hole 41a as in the embodiment.

In Modification 2 as well, it is possible to uniformly supply the processing liquid L to the entire surface of the wafer W by disposing the through holes 41a so as to at least face the central portion of the wafer W held by the substrate holding unit 31.

Next, Modification 3 of the processing unit 16 will be described with reference to FIGS. 8A to 8D. FIGS. 8A to 8D are schematic views (1) to (4) illustrating steps of a liquid processing by the processing unit 16 according to Modification 3 of the embodiment. In addition, FIGS. 8A to 8D show schematic perspective views of the processing unit 16.

Figure 8A:
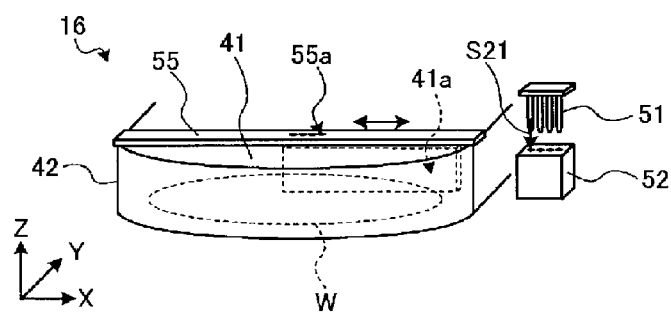
FIG. 8A is a schematic view (1) illustrating a step of a liquid processing by a processing unit according to Modification 3 of the embodiment.

As illustrated in FIG. 8A, in the processing unit 16 according to Modification 3, a slit-shaped through hole 41a is formed in the top plate portion 41 in the form of a straight line from the center to the outer edge of the wafer W. In addition, a scan top plate 55 is disposed so as to cover the through hole 41a and to extend from the outer edge of the wafer W at one side to the outer edge of the wafer W at the other side. The scan top plate 55 is configured to be movable along the through hole 41a.

In addition, in the processing unit 16 of Modification 3, a plurality of processing liquid nozzles 51 are provided as pickup nozzles. Then, a plurality of through holes 55a into which the plurality of processing liquid nozzles 51 are insertable are formed in the scan top plate 55.

In the processing unit 16 of Modification 3, first, dummy dispensing of the processing liquid L is performed from the processing liquid nozzle 51 (step S21).

Figure 8B:
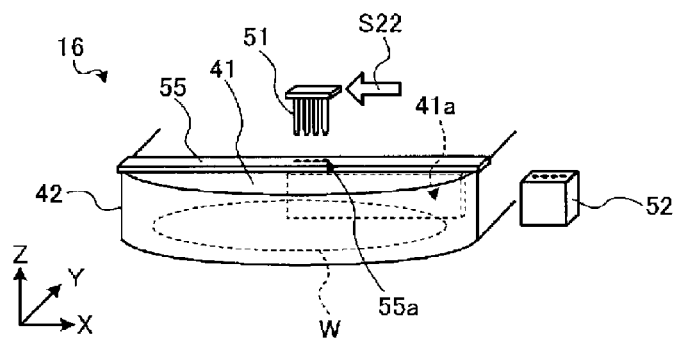
FIG. 8B is a schematic view (2) illustrating a step of a liquid processing by the processing unit according to Modification 3 of the embodiment.

Next, as illustrated in FIG. 8B, the processing unit 16 picks up the processing liquid nozzle 51 in a transport unit (not illustrated), and transports the processing liquid nozzle 51 to the upper side of the central portion of the wafer W (step S22). In addition, in step S22, the through hole 55a in the scan top plate 55 is disposed above the central portion of the wafer W.

Figure 8C:
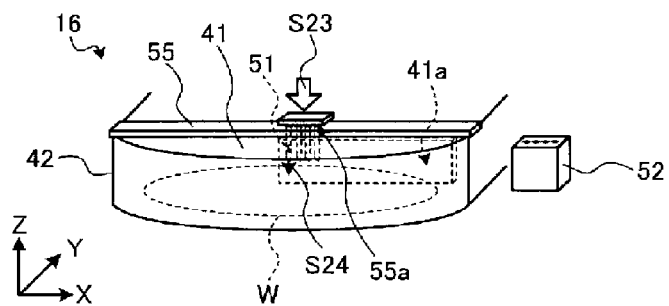
FIG. 8C is a schematic view (3) illustrating a step of a liquid processing by the processing unit according to Modification 3 of the embodiment.

Next, as illustrated in FIG. 8C, the processing unit 16 inserts the processing liquid nozzle 51 into the through hole 41a in the top plate portion 41 through the through hole 55a of the scan top plate 55 (step S23). Then, the processing unit 16 supplies the processing liquid L to the wafer W from the processing liquid nozzle 51 inserted into the through hole 41a (step S24).

Figure 8D:
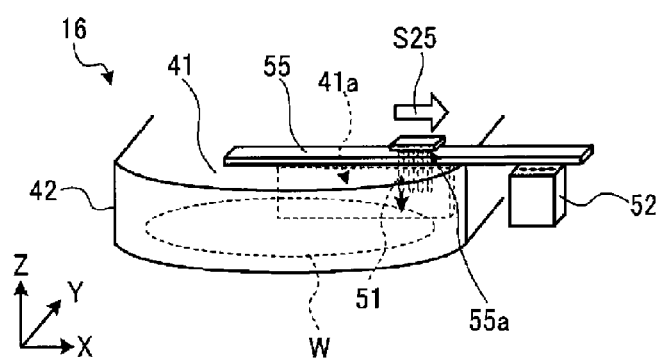
FIG. 8D is a schematic view (4) illustrating a step of a liquid processing by the processing unit according to Modification 3 of the embodiment.

Next, as illustrated in FIG. 8D, the processing unit 16 causes the processing liquid nozzle 51 from which the processing liquid L is ejected to perform scan on the wafer W while shifting the processing liquid nozzle 51 in synchronization with the scan top plate 55 (Step S25). In step S25, the processing liquid nozzle 51 may be shifted by the transport unit that picks up the processing liquid nozzle 51, or the processing liquid nozzle 51 may be shifted by the scan top plate 55.

As described above, in Modification 3, by covering the through hole 41a with the scan top plate 55 moving in synchronization with the processing liquid nozzle 51, it is possible to suppress the air atmosphere of the second space A2 from flowing into the first space A1 via the through hole 41a. Therefore, according to Modification 3, it is possible to favorably maintain the first space A1 in the atmosphere adjusted to a predetermined condition.

Figure 9A:
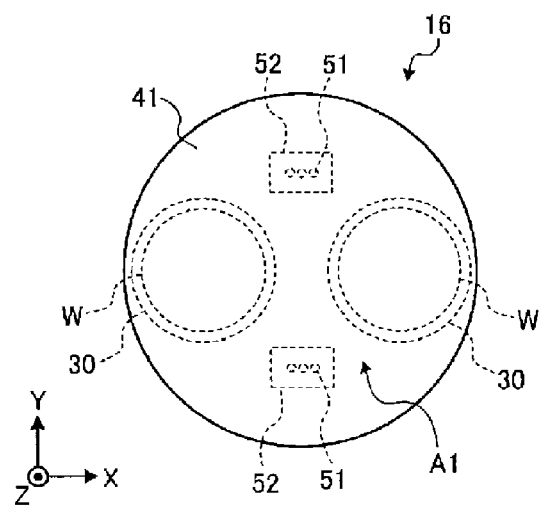
FIG. 9A is a schematic view (1) illustrating a step of a liquid processing by a processing unit according to Modification 4 of the embodiment.
Figure 9B:
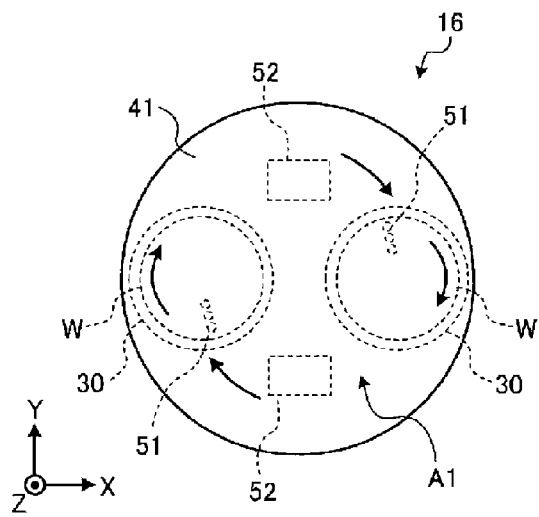
FIG. 9B is a schematic view (2) illustrating a step of a liquid processing by the processing unit according to Modification 4 of the embodiment.
Figure 9C:
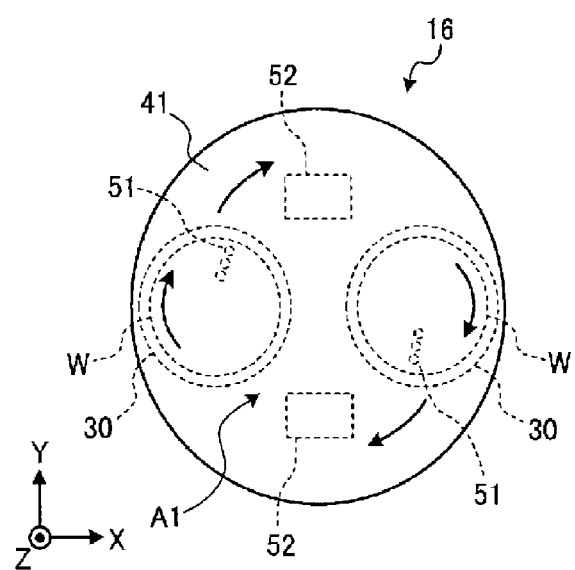
FIG. 9C is a schematic view (3) illustrating a step of a liquid processing by the processing unit according to Modification 4 of the embodiment.

Next, Modification 4 of the processing unit 16 will be described with reference to FIGS. 9A to 9C. FIGS. 9A to 9C are schematic views (1) to (3) illustrating steps of a liquid processing by the processing unit 16 according to Modification 4 of the embodiment. In addition, FIGS. 9A to 9C illustrate schematic top plan views of the processing unit 16.

In Modification 4, a plurality of (e.g., two) substrate processing units 30 are provided in one processing unit 16, and a plurality of wafers W may be collectively processed in the one processing unit 16. In addition, the top plate portion 41 of Modification 4 is disposed so as to cover all of the plurality of substrate processing units 30, and is configured to be rotatable above the substrate processing units 30.

In addition, in Modification 4, processing liquid nozzles 51 are provided in the top plate portion 41, and nozzle buses 52 are provided in the first space A1 partitioned by, for example, the top plate portion 41. In the example illustrated FIG. 9A, two sets of three processing liquid nozzles 51 and one nozzle bus 52 are provided.

As illustrated in FIG. 9A, first, the processing unit 16 of Modification 4 performs dummy dispensing of the processing liquid L from the processing liquid nozzles 51 disposed above the nozzle buses 52. Next, as illustrated in FIG. 9B, the processing unit 16 rotates the top plate portion 41 to move the processing liquid nozzles 51 to the upper sides of wafers W.

Then, the processing unit 16 supplies the processing liquid L to the wafers W by the processing liquid nozzles 51 while rotating the wafers W by the substrate processing units 30.

In addition, as illustrated in FIG. 9C, the processing unit 16 further rotates the top plate portion 41 while supplying the processing liquid L by the processing liquid nozzles 51, and causes the processing liquid nozzle 51 to perform scan above the wafers W.

As described above, in Modification 4, it is possible to supply the processing liquid L to the plurality of wafers W in the first space A1 which is partitioned by, for example, the top plate portion 41 and has an atmosphere which is adjusted by the atmosphere adjustment gas.

In Modification 4, as illustrated in, for example, FIG. 9A, the processing liquid nozzles 51 may be provided by the number which corresponds to the number of substrate processing units 30. Thus, in Modification 4, it is possible to perform a liquid processing simultaneously on the plurality of wafers W accommodated in the processing unit 16.

In Modification 4, the processing liquid nozzles 51 may be disposed so as to pass at least the central portions of the wafers W when the top plate portion 41 is rotated. This makes it possible to uniformly supply the processing liquid L to the entire surfaces of the wafers W.

The substrate processing apparatus (processing unit 16) according to the embodiment includes a substrate holding unit 31, a top plate 41, a gas supply unit 44, a processing liquid nozzle 51, and an arm 53. The substrate holding unit 31 holds a substrate (wafer W). The top plate portion 41 is provided to face the substrate (wafer W) held by the substrate holding unit 31, and a through hole 41 a is formed at a position facing at least the center of the substrate (wafer W). The gas supply unit 44 supplies an atmosphere adjustment gas for adjusting the atmosphere to the space (the first space A1) between the substrate holding unit 31 and the top plate portion 41. The processing liquid nozzle 51 ejects the processing liquid L for processing the substrate (wafer W) onto the substrate (wafer W). The arm 53 holds the processing liquid nozzle 51 and moves the processing liquid nozzle 51 between a processing position at which the processing liquid L is ejected from the processing liquid nozzle 51 via the through hole 41 a and a standby position outside the wafer W. This makes it possible to reduce the amount of use of the atmosphere adjustment gas when performing the liquid processing on the wafer W.

Further, in the substrate processing apparatus (processing unit 16) according to the embodiment, the top plate portion 41 includes the inflow suppressing portion 45 that suppresses a gas, which is different from the atmosphere adjustment gas, from flowing into the space (first space A1) between the substrate (wafer W) and the top plate portion 41 via the through hole 41 a. This makes it possible to favorably maintain the first space A1 in the atmosphere adjusted to the predetermined condition.

In addition, in the substrate processing apparatus (processing unit 16) according to the embodiment, the through hole 41a is in the form of a slit. This makes it possible to scan-shift the processing liquid nozzle 51 in the through hole 41a.

Further, the substrate processing apparatus (processing unit 16) according to Modification 3 further includes a scan top plate 55 disposed to cover the slit-shaped through hole 41a and is scanned on the substrate (wafer W) in synchronization with the processing liquid nozzle 51. This makes it possible to favorably maintain the first space A1 in the atmosphere adjusted to the predetermined condition.

In addition, in the substrate processing apparatus (processing unit 16) according to Modification 4, a plurality of substrate holding units 31 are provided side by side. In addition, the top plate portion 41 is disposed so as to cover the plurality of substrate holding units 31 and is rotatable on the plurality of substrate holding units 31. Therefore, it is possible to supply the processing liquid L to the plurality of wafers W in the first space A1 which is partitioned by, for example, the top plate portion 41 and has an atmosphere which is adjusted by the atmosphere adjustment gas.

Further, in the substrate processing apparatus (processing unit 16) according to the embodiment, the top plate portion 41 has the convex portion 41b protruding toward the substrate (wafer W), and the outer diameter of the convex portion 41b is larger than the outer diameter of the substrate (wafer W). Therefore, even if the processing liquid L remains at the outer edge of the convex portion 41b after the liquid processing, it is possible to suppress the remaining processing liquid L from adhering to the wafer W.

In addition, the substrate processing apparatus (processing unit 16) according to the embodiment further includes a liquid receiving portion 33 disposed to surround the outer edge of the substrate holding unit 31 and configured to receive the processing liquid L by which a liquid processing was performed. In addition, the inner diameter of the liquid receiving cup 33 is larger than the outer diameter of the convex portion 41b. This makes it possible to bring the top plate portion 41 close to the wafer W without interfering with the liquid receiving cup 33.

<Details of Liquid Processing>

Figure 10:
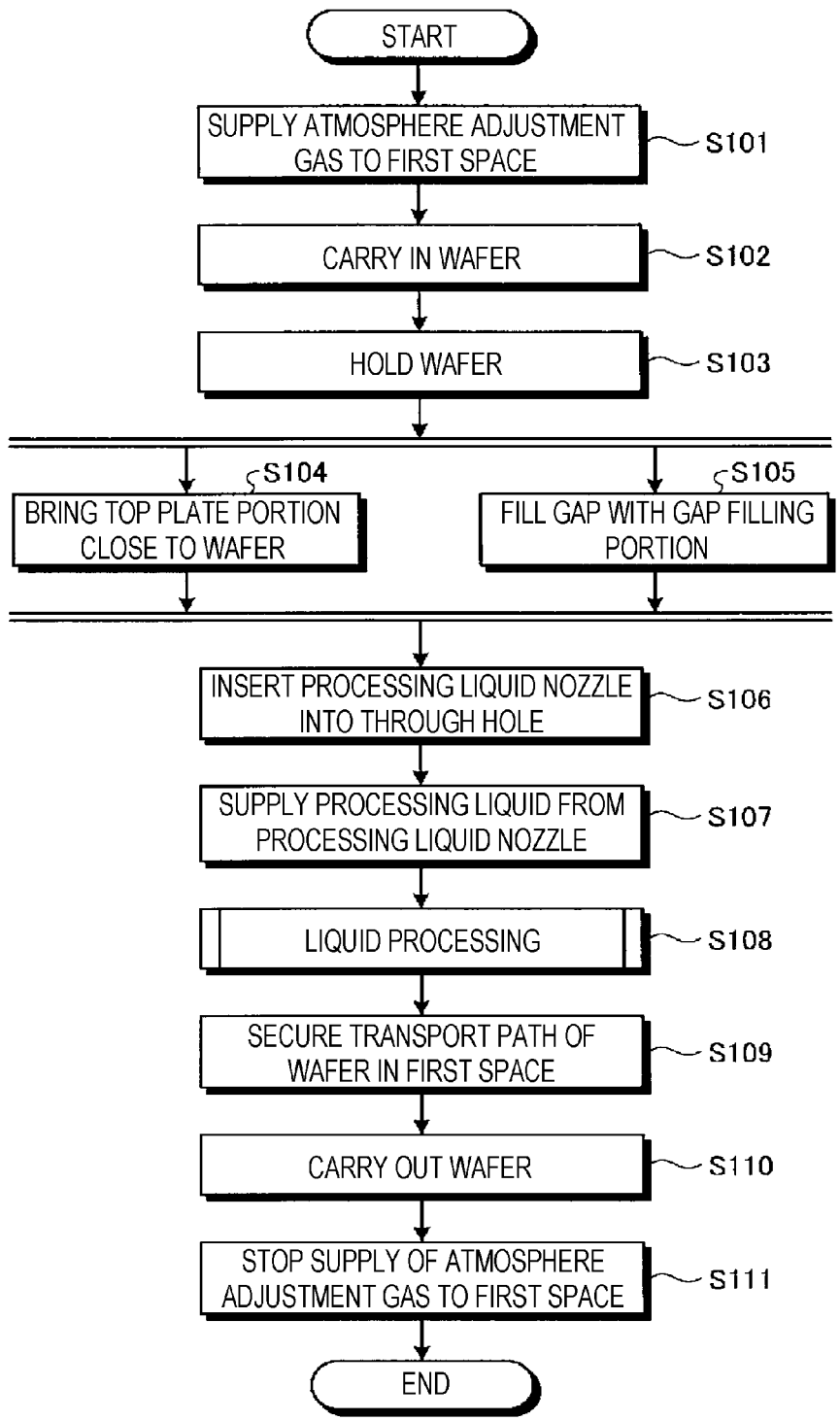
FIG. 10 is a flowchart illustrating the processing procedure of an entire liquid processing according to an embodiment.

Subsequently, details of a liquid processing according to an embodiment will be described with reference to FIGS. 10 and 11. FIG. 10 is a flowchart illustrating the processing procedure of the entire liquid processing according to the embodiment.

Figure 11:
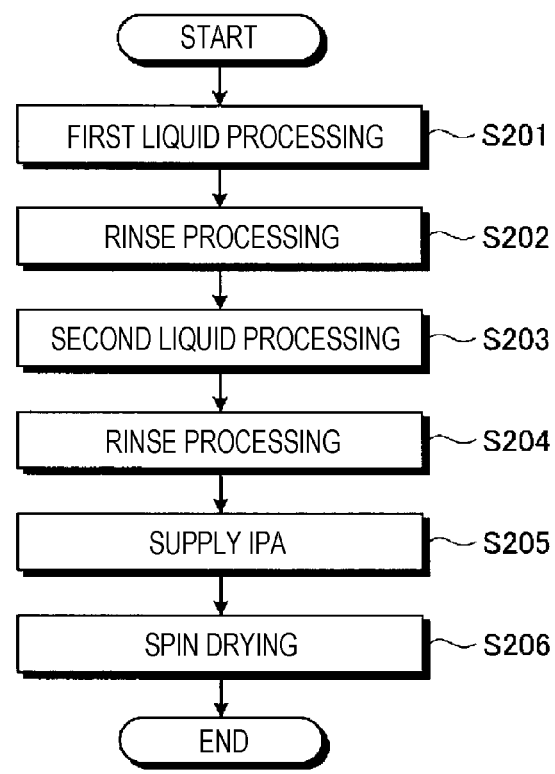
FIG. 11 is a flowchart illustrating the processing procedure of the entire liquid processing according to the embodiment.

The controller 18 reads a program installed in the memory 19 from the storage medium according to an embodiment, and the controller 18 controls, for example, the transport section 12, the transport section 15 and a processing unit 16 performs the conveyance unit 12 on the basis of a read instruction, whereby the liquid processing illustrated in FIGS. 10 and 11 is executed.

First, the controller 18 controls the gas supply unit 44 of the processing unit 16 to supply the atmosphere adjustment gas to the first space A1 partitioned by the partition unit 40 (step S101). Subsequently, the controller 18 controls the substrate transport device 13 and the substrate transport device 17 so as to carry a wafer W from a carrier C into a processing unit 16 via the substrate transport device 13, the delivery unit 14, and the substrate transport device 17 (step S102).

Next, the controller 18 controls the substrate processing unit 30 of the processing unit 16 such that the substrate holding unit 31 holds the wafer W (step S103). Step S103 is performed, for example, by moving the wafer W carried to the upper side of the substrate holding unit 31 with the column portion 32, which has been moved upward, then moving the wafer W downward, and holding the wafer W by the substrate holding unit 31.

Next, the controller 18 controls the partition unit 40 of the processing unit 16 to bring the top plate portion 41 close to the wafer W (step S104). In addition, in parallel to the processing of step S104, the controller 18 controls the partition unit 40 to fill the gap of the first space A1 with the gap filling portion 43 (step S105).

Next, the controller 18 controls the liquid supply unit 50 of the processing unit 16 to insert the processing liquid nozzle 51 into the through hole 41a in the top plate 41 (step S106). Then, the controller 18 controls the liquid supply unit 50 to supply the processing liquid L to the wafer W from the processing liquid nozzle 51 (step S107).

Next, the controller 18 controls the substrate processing unit 30 to perform a liquid processing on the wafer W (step S108). Step S108 is performed, for example, by rotating the substrate holding unit 31 to rotate the wafer W to move the processing liquid L supplied to the wafer W to the outer peripheral side. In addition, steps S107 and S108 described above are performed so as to fill the space between the top plate portion 41 and the wafer W with the processing liquid L.

Next, the controller 18 controls the partition unit 40 to secure the transport path of the wafer W in the first space A1 (step S109). Step S109 is performed, for example, by causing the top plate portion 41 to retreat upward from the transport path of the wafer W and the gap filling portion 43 to retreat downward.

Next, the controller 18 controls the substrate processing unit 30, the substrate transport device 17, and the substrate transport device 13 such that the wafer W is carried out from the inside of the processing unit 16 to the carrier C via the substrate transport device 17, the delivery unit 14, and the substrate transport device 13 (step S110).

Finally, the controller 18 controls the gas supply unit 44 to stop the supply of the atmosphere adjustment gas to the first space A1 partitioned by the partition unit 40 (step S111), and the processing is completed.

FIG. 11 is a flowchart illustrating a detailed processing procedure of the liquid processing (the above-described step S108) according to the embodiment.

In the liquid processing of the embodiment, first, a first liquid processing is performed with a predetermined first processing liquid (step S201). The first liquid processing is performed, for example, by supplying the first processing liquid such as, for example, an acid-based processing liquid such as, for example, DHF, or an alkali-based processing liquid such as, for example, SC1, to the wafer W from the processing liquid nozzle 51.

Next, a rinse processing is performed with a predetermined rinse liquid (step S202). The rinse processing is performed, for example, by supplying a rinse liquid such as, for example, DIW, to the wafer W from the processing liquid nozzle 51. In addition, the first processing liquid adhering to the top plate portion 41 from the surface may also be removed by this rinse processing.

Next, a predetermined second processing liquid is performed with a predetermined second processing liquid (step S203). The second liquid processing is performed, for example, by supplying the second processing liquid such as, for example, an acid-based processing liquid such as, for example, DHF, or an alkali-based processing liquid such as, for example, SC1, to the wafer W from the processing liquid nozzle 51.

Next, a rinse processing is performed with a predetermined rinse liquid (step S204). The rinse processing is the same processing as step S202. In addition, the second processing liquid adhering to the top plate portion 41 may also be removed from the surface by this rinse processing.

Next, IPA is supplied to the wafer W using the processing liquid nozzle 51 (step S205). Finally, the wafer W is spin-dried by spinning the wafer W supplied with the IPA (step S206), and the processing is completed.

The substrate processing method according to the embodiment includes a step of supplying an atmosphere adjustment gas, a step of holding a substrate by the substrate holding unit 31, and a step of performing a liquid processing. In the step of supplying the atmosphere adjustment gas, an atmosphere adjustment gas for adjusting the atmosphere is supplied to the space (first space A1) between the substrate holding unit 31 holding the substrate (wafer W) and the top plate portion 41 provided facing the substrate holding unit 31. In the liquid processing step, the processing liquid L is supplied to the substrate (wafer W) using the through hole 41a formed in the top plate portion 41 to perform the liquid processing. This makes it possible to reduce the amount of use of the atmosphere adjustment gas when performing the liquid processing on the wafer W.

In addition, the substrate processing method according to the embodiment further includes a step of inserting the processing liquid nozzle 51 into the through hole 41a to eject discharge the processing liquid L. This makes it possible to favorably maintain the first space A1 in the atmosphere adjusted to the predetermined condition.

In addition, the substrate processing method according to the embodiment further includes a step of bringing the top plate portion 41 close to the substrate (wafer W) held by the substrate holding unit 31. As a result, since it is possible to narrow the first space A1, it is possible to further reduce the amount of use of the atmosphere adjustment gas.

In addition, in the substrate processing method according to the embodiment, in the liquid processing step, the space between the top plate portion 41 and the substrate (wafer W) is filled with the processing liquid L. Therefore, it is possible to perform the liquid processing of the wafer W in a favorable state.

In addition, the storage medium according to the embodiment stores a program that causes a computer to execute the substrate processing method described above. This makes it possible to reduce the amount of use of the atmosphere adjustment gas when performing the liquid processing on the wafer W.

Although the embodiments of the present disclosure have been described above, the present disclosure is not limited thereto, and various modifications can be made without departing from the gist thereof. For example, in the above-described embodiments, the case where the space between the top plate portion 41 and the wafer W is filled with the processing liquid L has been described, but when the atmosphere adjustment gas is supplied between the top plate portion 41 and the wafer W, it is not necessary to fill the space between the top plate 41 and the wafer W with the processing liquid L. Further, the supply amount of the atmosphere adjustment gas may be changed during the processing.

According to the present disclosure, it is possible to reduce the amount of use of an atmosphere adjustment gas when processing a substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising: a substrate holder configured to hold a substrate; a top plate installed to face the substrate held on the substrate holder, and having a through hole formed therethrough at a position facing a center of the substrate; a gas supply configured to supply an atmosphere adjustment gas; an ejection nozzle provided in the top plate and connected to the gas supply, the ejection nozzle configured to supply the atmosphere adjustment gas to a space between the substrate holder and the top plate; a processing liquid nozzle configured to eject a processing liquid to the substrate; and an arm configured to hold the processing liquid nozzle and move the processing liquid nozzle between a processing position where the processing liquid nozzle is inserted into the through hole such that processing liquid is ejected from the processing liquid nozzle through the through hole and a standby position where the processing liquid nozzle is removed from the through hole; wherein the top plate includes an inflow suppressor configured to suppress a gas different from the atmosphere adjustment gas from flowing into the space between the substrate and the top plate via the through hole.

2. The substrate processing apparatus according to claim 1, wherein the through hole is in a form of a slit.

3. The substrate processing apparatus according to claim 2, further comprising:
a scanning plate disposed to cover the through hole in the form of a slit, and scan the substrate in synchronization with the processing liquid nozzle.

4. The substrate processing apparatus according to claim 2, wherein the top plate has a convex portion protruding toward the substrate, and
an outer diameter of the convex portion is larger than an outer diameter of the substrate.

5. The substrate processing apparatus according to claim 1, wherein the top plate has a convex portion protruding toward the substrate, and an outer diameter of the convex portion is larger than an outer diameter of the substrate.

6. The substrate processing apparatus according to claim 5, further comprising:
a cup disposed to surround an outer edge of the substrate holder and configured to receive the processing liquid used in a liquid process,
wherein an inner diameter of the liquid receiving cup is larger than the outer diameter of the convex portion.

7. The substrate processing apparatus according to claim 1, wherein the through hole is in a form of a slit.

8. The substrate processing apparatus according to claim 7, further comprising:
a scanning plate disposed to cover the through hole in the form of a slit, and scan the substrate in synchronization with the processing liquid nozzle.

9. The substrate processing apparatus according to claim 7, wherein the top plate has a convex portion protruding toward the substrate, and
an outer diameter of the convex portion is larger than an outer diameter of the substrate.

* * * * *